US009087765B2

(12) United States Patent
Chun et al.

(10) Patent No.: US 9,087,765 B2
(45) Date of Patent: Jul. 21, 2015

(54) SYSTEM-IN-PACKAGE WITH INTERPOSER PITCH ADAPTER

(71) Applicant: QUALCOMM Incorporated, San Diego, CA (US)

(72) Inventors: Dexter Tamio Chun, San Diego, CA (US); Jungwon Suh, San Diego, CA (US); Urmi Ray, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/839,816

(22) Filed: Mar. 15, 2013

(65) Prior Publication Data
US 2014/0264836 A1 Sep. 18, 2014

(51) Int. Cl.
*H01L 23/498* (2006.01)
*H01L 21/56* (2006.01)
*H01L 23/16* (2006.01)
*H01L 23/14* (2006.01)
*H01L 23/31* (2006.01)
*H01L 23/373* (2006.01)
*H01L 23/15* (2006.01)

(52) U.S. Cl.
CPC .............. *H01L 23/16* (2013.01); *H01L 23/147* (2013.01); *H01L 23/49827* (2013.01); *H01L 23/15* (2013.01); *H01L 23/3128* (2013.01); *H01L 23/3737* (2013.01); *H01L 23/49816* (2013.01); *H01L 2224/13* (2013.01); *H01L 2924/15311* (2013.01)

(58) Field of Classification Search
CPC .............................. H01I 23/4981; H01I 21/56
USPC .............. 257/738, 778, 777, 723, 686, 685, 257/E23.168, E23.011, 773, 774, 73; 438/107
See application file for complete search history.

(56) References Cited

U.S. PATENT DOCUMENTS

| 5,800,184 | A  | * | 9/1998 | Lopergolo et al. | 439/66 |
|---|---|---|---|---|---|
| 6,469,395 | B1 |   | 10/2002 | Nishihara et al. | |
| 7,224,280 | B2 | * | 5/2007 | Ferguson et al. | 340/572.7 |
| 8,034,660 | B2 | * | 10/2011 | Takahashi | 438/108 |
| 8,093,704 | B2 |   | 1/2012 | Palmer et al. | |
| 8,203,849 | B2 |   | 6/2012 | Shibamoto | |
| 8,634,221 | B2 | * | 1/2014 | Thayer | 365/52 |
| 2006/0157843 | A1 |   | 7/2006 | Hwang | |
| 2011/0042795 | A1 | * | 2/2011 | Knickerbocker | 257/686 |
| 2012/0001339 | A1 |   | 1/2012 | Malatkar | |
| 2013/0044554 | A1 | * | 2/2013 | Goel et al. | 365/200 |
| 2013/0049224 | A1 | * | 2/2013 | Sutardja | 257/774 |
| 2013/0214432 | A1 | * | 8/2013 | Wu et al. | 257/782 |
| 2013/0295727 | A1 | * | 11/2013 | Hsu et al. | 438/130 |
| 2014/0070368 | A1 | * | 3/2014 | Oyamada et al. | 257/532 |

OTHER PUBLICATIONS

Lee, et al., "Package-on-Package (PoP) for Advanced PCB Manufacturing Process", 7th International Conference on Electronic Packaging Technology, ICEPT, 2006, pp. 34-40.

* cited by examiner

*Primary Examiner* — Alexander Oscar Williams
(74) *Attorney, Agent, or Firm* — Haynes and Boone, LLP

(57) ABSTRACT

An integrated circuit package is disclosed that includes a first-pitch die and a second-pitch die. The second-pitch die interconnects to the second-pitch substrate through second-pitch substrates. The first-pitch die interconnects through first-pitch interconnects to an interposer adapter. The pitch of the first-pitch interconnects is too fine for the second-pitch substrate. But the interposer adapter interconnects through second-pitch interconnects to the second-pitch substrate and includes through substrate vias so that I/O signaling between the first-pitch die and the second-pitch die can be conducted through the second-pitch substrate and through the through substrate vias in the interposer adapter.

19 Claims, 7 Drawing Sheets

SYSTEM-IN-PACKAGE WITH INTERPOSER PITCH ADAPTER

TECHNICAL FIELD

This application relates to integrated circuit packaging, and more particularly to a system-in-package structure including an interposer providing pitch adaptation.

BACKGROUND

Advanced memory technologies such as Wide I/O offer substantial improvements in performance yet have lower power consumption. A Wide I/O memory device provides four 128-bit words at a 200 MHz rate. To accommodate such a large number of input/output signals, Wide I/O memories require a very high density interconnect pitch to adjoining devices or substrates. Although organic substrates used in applications such as Package-on-Package (PoP) offer advantageously low cost, they cannot support such fine-pitch interconnections. Thus, designers are forced to interface other components to Wide I/O memories using an interposer with through substrate vias (TSVs) such as a through-silicon-via-containing silicon interposer (or alternatively, a through-glass-via-containing glass interposer). The through silicon vias are readily arranged on a silicon interposer to accommodate the fine pitch necessary for interconnections to such advanced memory devices.

FIG. 1A shows an example Wide I/O interposer system-in-package 100. As used herein, a fine-pitch die such as a Wide I/O memory is denoted as a first-pitch die 105. In contrast, a coarser-pitch die such as an SOC is referred to herein as a second-pitch die 110. To accommodate the I/O signaling between first-pitch die 105 and second-pitch die 110, both these dies are interconnected through corresponding first-pitch and second-pitch interconnects to an interposer 115. Interposer 115 includes a plurality of metal layers on a front surface facing first-pitch die 105 and second-pitch die 110. Thus, pads on first-pitch die 105 may interconnect through first-pitch interconnects such as micro-bumps to corresponding pads on interposer 115. Lateral interconnects in one or more of the metal layers on interposer 115 couple I/O signals between second-pitch die 110 and first-pitch die 105. Second-pitch die 110 may interconnect to interposer 115 through second-pitch interconnects such as thermo-compression flip-chip bumps (TCFCs). In this fashion, the majority of the I/O signaling between second-pitch die 110 and first-pitch die memory 105 may be conducted in the lateral interconnects in the metal layers on the front surface of interposer 115. The pads for these devices are not shown in FIG. 1A for illustration clarity.

Signals between second-pitch die 110 and external devices are conducted in through silicon vias 106 in interposer 115 that interconnect through second-pitch interconnects to pads on a second-pitch substrate 120 such as an organic substrate. As used herein, a "second-pitch" substrate is a substrate that can only accommodate the relatively coarser pitch for the second-pitch interconnects such as TCFCs that interconnect second-pitch die 110 to interposer 115. The external signals coupled to second-pitch substrate 120 through vias 106 as well as ground and power may then couple through vias and metal layers in second-pitch substrate 120 and bottom solder balls 107 to the external devices. A similar coupling through additional vias 106 occurs for external signals for first-pitch die 105.

Unlike second-pitch substrate 120, the interposer 115 can accommodate the fine pitch of first-pitch interconnects such as micro-bumps for interconnecting to first-pitch die 105. The majority of the signal routing between second-pitch die 110 and first-pitch die 105 thus travels through interposer 115 without any need to pass through second-pitch substrate 120. Interposer 115 interconnects to second-pitch substrate 120 through second-pitch interconnects such as copper pillar TCFCs. The cost of an interposer such as interposer 115 is dependent upon its size. The silicon or glass interposer 115 must be relatively large to receive both second-pitch die 110 and fine-pitch die 105 and is thus costly.

Because of this cost, the packaging of first-pitch dies such as Wide I/O memories with second-pitch dies such as SOCs is also accomplished using a through silicon stack (TSS) 130 as shown in FIG. 1B. In TSS 130, a second-pitch die 140 includes a plurality of through silicon vias that couple to corresponding through silicon vias in a first-pitch die 145. The through silicon vias in first-pitch die 145 in turn may couple communicate with through silicon vias in an overlying first-pitch die 150, and so on. In this fashion, a number of first-pitch dies may be stacked onto second-pitch die 140 to complete TSS 130. In general, a stacking of coupled integrated circuit devices (e.g., without wirebonding) is not limited to silicon such that other materials may be used. Thus, as used herein, the term "TSS" is not limited to just stacked silicon dies. Although TSS 130 accommodates one (or more) first-pitch memories without the need for an interposer, the TSV technology is troublesome and may have relatively poor reliability and a corresponding high defect rate.

Accordingly, there is a need in the art for improved packaging techniques to accommodate the packaging of modern first-pitch dies with second-pitch dies or other integrated circuits.

SUMMARY

To achieve a system-in-package assembly that does not require an interposer large enough to receive both a first-pitch die such as a Wide I/O memory die as well as a second-pitch die such as an SOC, an interposer adapter is disclosed. The pitch of first-pitch interconnects for interconnecting to the first-pitch die is finer than the coarser pitch of second-pitch interconnects for interconnecting to the second-pitch die. A second-pitch substrate cannot accommodate the fine pitch for the first-pitch interconnects but can accommodate the coarser pitch for interconnecting through the second-pitch interconnects to the second-pitch die.

The interposer adapter performs a fanout between the fine pitch of the first-pitch interconnects to the coarser pitch of the second-pitch interconnects. To accommodate I/O signaling between the first-pitch die and the second-pitch die, the second-pitch substrate includes a plurality of lateral interconnects.

Advantageously, the interposer adapter need not have a size sufficient to accommodate first-pitch interconnects to interconnect to the first-pitch die and to accommodate second-pitch interconnects to interconnect to the second-pitch die. Instead, the interposer adapter need merely accommodate the first-pitch interconnects to interconnect to the first-pitch die and second-pitch interconnects to interconnect the interposer adapter to the second-pitch substrate. Thus the interposer adapter may be significantly smaller than a conventional interposer. In that regard, since prior art first-pitch and second-pitch dies both were interconnected to an interposer, they could not be stacked relative to each other and so had to be laterally disposed on a conventional interposer such as shown in FIG. 1A. Such a conventional interposer thus required a lateral extent sufficient to accommodate the lateral displacement of the first-pitch and second-pitch dies. But the interposer adapter disclosed herein needs no such lateral extent because the second-pitch die interconnects through second-pitch interconnects to the second-pitch substrate, not the interposer adapter. Instead, it is the second-pitch substrate that provides the lateral extent to accommodate interconnections to both the second-pitch die and to the interposer adapter. But a second-pitch substrate may comprise, for example, an organic substrate. The cost per unit of surface area for an organic substrate is significantly lower than the cost for per unit of surface area for an interposer. Thus, the interposer adapter disclosed herein substantially lowers costs with regard to the packaging of first-pitch and second-pitch dies.

In addition, a conventional interposer required lateral interconnections to conduct the I/O signaling between the first-pitch and second-pitch dies. The second-pitch substrate thus includes analogs of the lateral interconnects that were previously required in a conventional interposer. But the accommodation of such lateral interconnects in a second-pitch substrate is much less costly as compared to the conventional interposer approach. Moreover, the interposer adapter is much more robust and less costly than packaging first-pitch and second-pitch dies together using a TSS such as discussed with regard to FIG. 1B.

DETAILED DESCRIPTION

To address the need in the art for improved packaging architectures that include first-pitch dies and second pitch dies, an interposer adapter is disclosed that is configured to accommodate a fanout between first-pitch interconnects and second-pitch interconnects.

Overview

The interposer adapter interconnects through a first set of second-pitch interconnects to a second-pitch substrate. A second-pitch die interconnects to the second-pitch substrate through a second set of second-pitch interconnects. But the second-pitch substrate cannot support the finer pitch of first-pitch interconnects. The interposer adapter, however, does support this pitch so that the first-pitch die interconnects to the interposer adapter through the first-pitch interconnects. In turn, the interposer adapter interconnects to the second-pitch substrate through the first set of first-pitch interconnects. The interposer adapter includes through substrate vias to route I/O signals for the first-pitch die. The I/O signaling between the first-pitch die and the second-pitch die routes laterally through lateral interconnects in the second-pitch substrate.

Figure 1A:
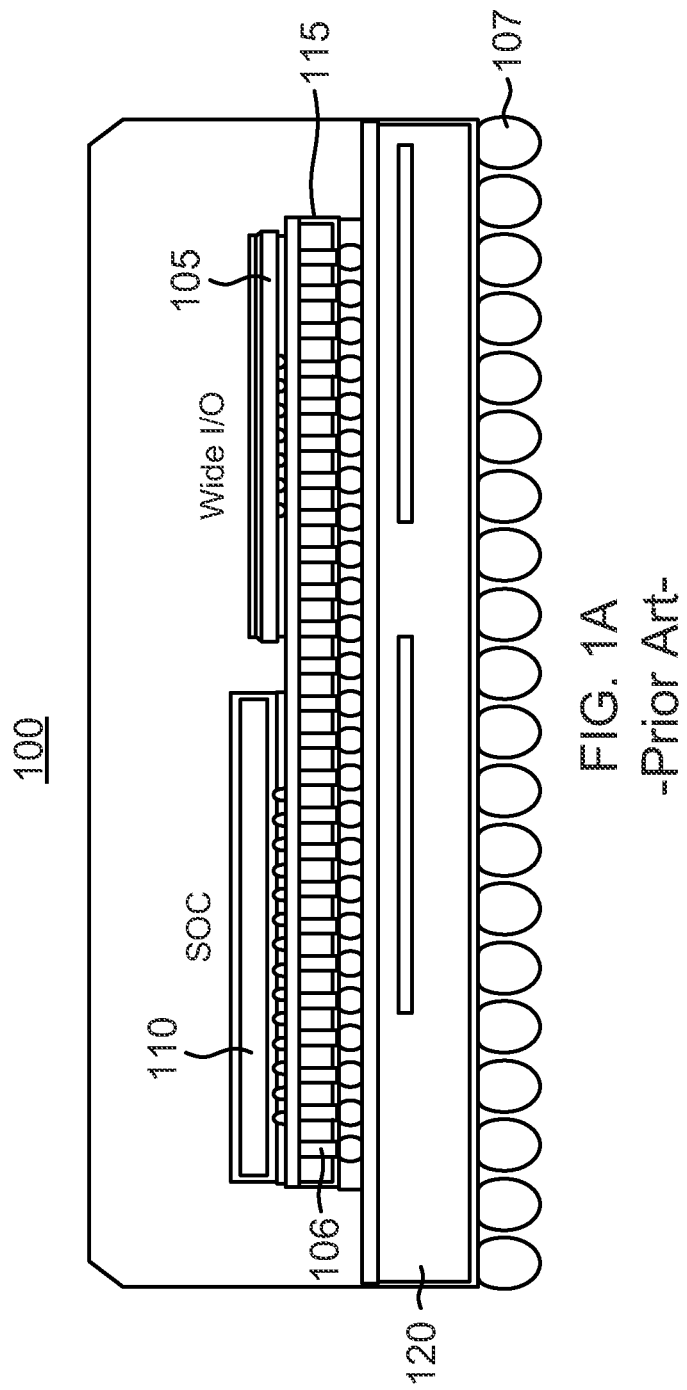
FIG. 1A is a cross-sectional view of a conventional system-in-package including a first-pitch memory die and a second-pitch SOC both mounted on an interposer.
Figure 1B:
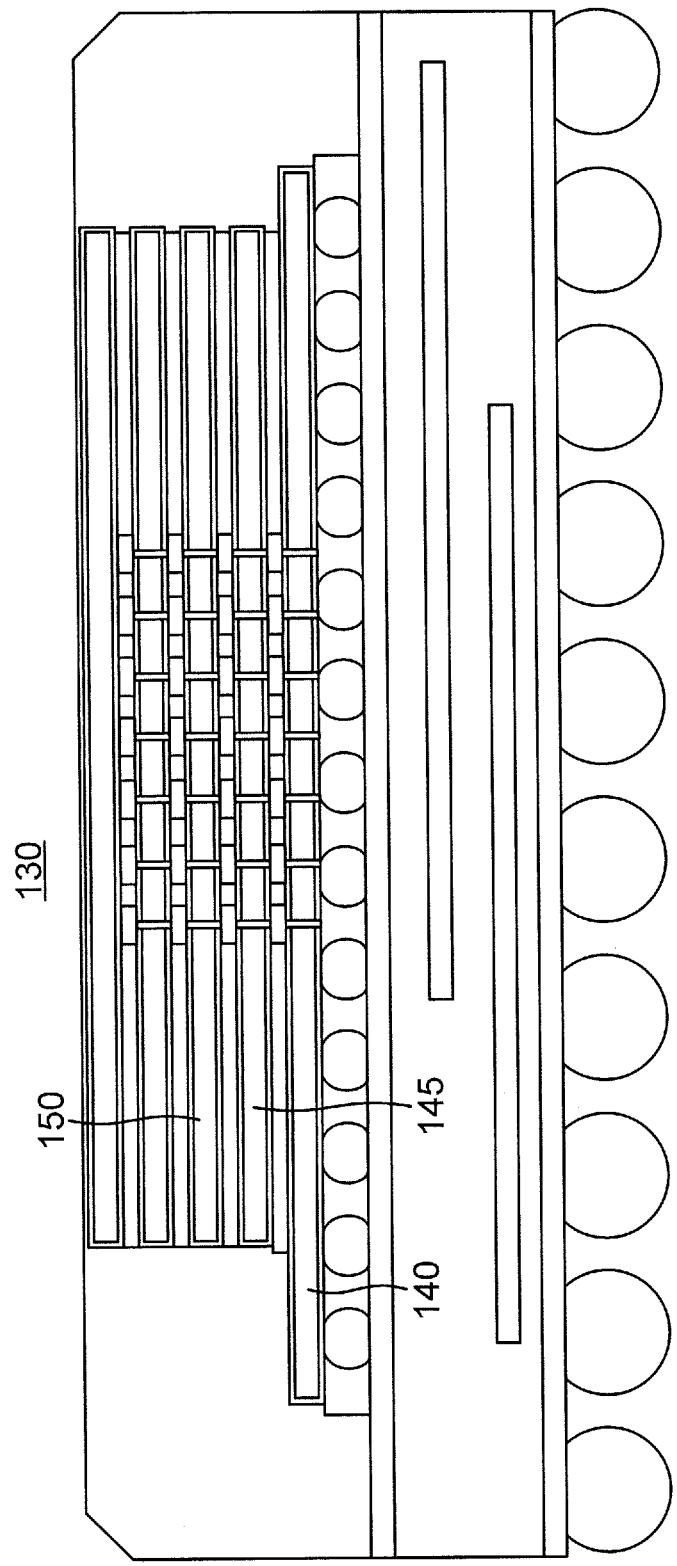
FIG. 1B is a cross-sectional view of a conventional through-silicon-stacking (TSS) stack including a through-silicon-via (TSV) containing a second-pitch die and one or more first-pitch dies.

Since the I/O signaling between the first-pitch and second-pitch dies is supported by the lateral interconnects in the second-pitch substrate, the resulting system-in-package construction avoids the need for a large interposer that would accommodate this I/O signaling. This is quite advantageous as the chief cost of an interposer is its size. The interposer adapter is typically substantially smaller than the die size for the first-pitch die. In contrast, a prior-art interposer such as interposer 115 of FIG. 1A is several times larger as it must be larger than the second-pitch die 110 and first-pitch die 105 combined. Accordingly, the system-in-package structures disclosed herein are advantageously less expensive to manufacture as compared to conventional interposer packages. Moreover, reliability is enhanced as compared to reliability issues for TSS 130 of FIG. 1B.

Reduced interposer cost is not the only advantage of the disclosed system-in-package structures. In addition, the interposer adapter may be interconnected to the first-pitch die before the interposer adapter is interconnected to the second-pitch substrate so that the first-pitch die can be fully tested prior to its integration into the resulting system-in-package structure. This is quite advantageous as first-pitch dies have too fine of a pitch to independently probe each pad prior to integration in a package. But when interconnected to an interposer adapter, a first-pitch die can have all its I/O signals readily tested in that a testing fixture can simultaneously probe all the second-pitch pads on the interposer adapter.

In addition, the large size of conventional interposer 115 of FIG. 1A presents mounting challenges in that second-pitch substrate 120 (e.g., an organic substrate) is prone to warpage when it is interconnected to an underlying circuit board. This in turn puts strain on interposer 115, which is problematic in that the fine-pitch interconnects to fine-pitch die 105 are relatively short. Thus, the lack of planarity and resulting strain in interposer 115 (from the warpage in substrate 120) in turn causes strain on fine-pitch die 105. Displacements as little as one micron can crack fine-pitch die 105 or interposer 115. But the smaller size of the interposer adapters disclosed herein will be more forgiving of the underlying substrate warpage. In this fashion, reliability of the first-pitch die is enhanced. In addition, the I/O signaling between the first-pitch die and the second-pitch die routes laterally through the second-pitch substrate, which minimizes the amount of signal routing within the interposer adapter. It is more expensive to accommodate such signal routing in a conventional interposer. These and other advantages are better appreciated with reference to the following specific embodiments of the resulting system-in-package construction.

Example Embodiments

Figure 2:
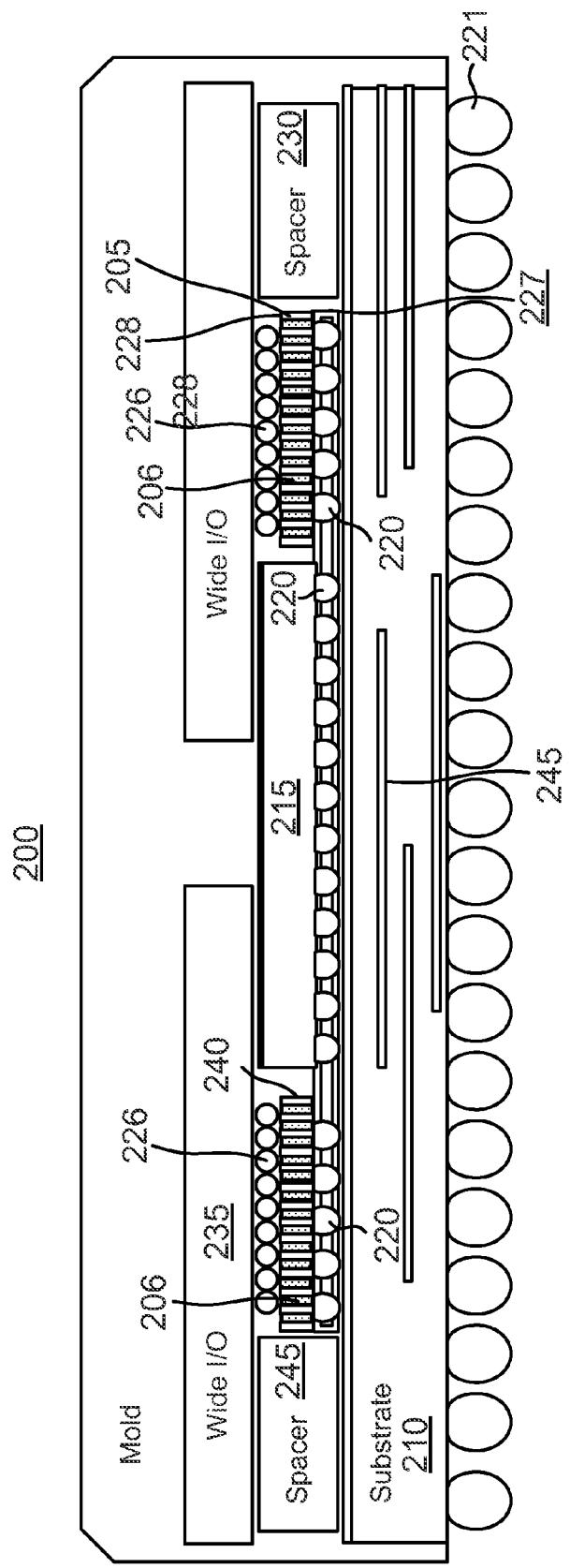
FIG. 2 is a cross-sectional view of a system-in-package that accommodates a first-pitch die using an interposer adapter.

FIG. 2 illustrates an example system-in-package 200 with an interposer adapter 205. A second-pitch die 215 interconnects to a second-pitch substrate 210 such as an organic substrate through second-pitch interconnects 220. In one embodiment, second-pitch die 215 is an SOC and second-pitch interconnects are copper pillars (TCFCs) having a pitch of 80 to 100 microns. Such a pitch is relatively fine compared to a circuit-board-mounting ball pitch for bottom balls 221 on a circuit-board-facing surface of second-pitch substrate 210. But it is relatively coarse as compared to the fine pitch necessary for first-pitch interconnects 226 such as micro-bumps to interconnect to a first-pitch die 225. For example, the pitch for first-pitch interconnects 226 in one embodiment is 40 microns.

As used herein, a "first-pitch" die such as first-pitch die 225 has a pitch that cannot be accommodated by second-pitch substrate 210. In that regard, the designations of "first-pitch" and "second-pitch" are relative terms and not tied to any given interconnect technology. Regardless of the particular pitch for first-pitch interconnects 226, it is defined herein to be less than the minimum pitch that second-pitch substrate 210 can accommodate. In turn, the pitch for second-pitch interconnects 220 is defined to be equal to the minimum pitch for second-pitch substrate 210 or larger. In one embodiment, first-pitch die 225 is a Wide I/O memory die having a 40 micron pitch. First-pitch interconnects 226 would thus have a matching pitch to accommodate such a die. Because of the finer pitch for first-pitch interconnects 226 as compared to second-pitch interconnects 220, the spacing (i.e., the pitch) between adjacent first-pitch interconnects 226 in FIG. 2 is smaller than the spacing between adjacent second-pitch interconnects 220.

Second-pitch substrate 210 may comprise an organic substrate. Alternatively, second-pitch substrate may comprise other suitable types of substrates such as a ceramic substrate. Organic substrates currently support a pad pitch for coupling to copper pillars (thermo-compression flip-chip bumps (TCFCs)) as minute as 80 to 100 microns. Organic substrates are advantageously inexpensive but prone to warpage and imprecise manufacturing tolerances and so cannot support finer pitches. An organic substrate satisfies the definition used herein of a "second-pitch substrate" with regard to a Wide I/O memory die because the organic substrate minimum pitch of 80 to 100 microns cannot support the 40 micron pitch for the Wide I/O memory die. Regardless of whether first-pitch die 225 is a Wide I/O memory die or some other type of first-pitch die, it by definition cannot interconnect to second-pitch substrate 210 through first-pitch interconnects 226. But interposer adapter 205 supports the pitch necessary to accommodate first-pitch interconnects 226. Thus, I/O signals for first-pitch die 225 (which includes its power and ground signals) couple through first-pitch interconnects 226 to pads (not illustrated) on a first-pitch-die facing surface 228 of interposer adapter. These pads thus comprise a first-pitch interface for interposer adapter 205 to accommodate the pitch of first-pitch interconnects 226.

Interposer adapter 205 also includes pads (not illustrated) on a substrate-facing surface 227 to couple to second-pitch interconnects 220. These pads thus comprise a second-pitch interface for accommodating the pitch of second-pitch interconnects 220. Analogous to interposer 115, interposer adapter 205 includes through substrate vias 206 to couple the first-pitch die's I/O signals between the first-pitch interface and second-pitch interface on opposing surfaces of interposer adapter 205. For example, if interposer adapter 205 comprises a silicon interposer adapter, through substrate vias 206 comprise through silicon vias. Alternatively, if interposer adapter 205 comprises a glass interposer adapter, through substrate vias 206 comprise through glass vias. Second-pitch interconnects 220 interconnect between pads on interposer adapter 205 to corresponding pads on second-pitch substrate 210.

To accommodate the fanout between first-pitch interconnects 226 and second-pitch interconnects 220, interposer adapter 205 may include a redistribution layer on its substrate-facing surface 227 and/or on its first-pitch-die-facing surface 228. For example, if a redistribution layer on surface 228 can accommodate the necessary fanout, through substrate vias 206 may then be spaced apart according to the pitch for second-pitch interconnects 220. There would then be no need for a redistribution layer on the opposing surface 227 of interposer adapter 205. But if such an additional redistribution layer is also included to accommodate the fanout, at least some of through substrate vias 206 may be spaced apart according to the pitch for first-pitch interconnects 226. It will be appreciated that traditional metal layers on interposer adapter 205 may also be used for the fanout in lieu of redistribution layer(s). The combination of the redistribution layer(s) (or traditional metal layers) and through substrate vias 206 in interposer adapter 205 serves as a means for interfacing between first-pitch interconnects 226 and second-pitch interconnects 220. With regard to such a means, first-pitch die 225 cannot directly interconnect through first-pitch interconnects 226 to second-pitch substrate 220. Similarly, second-pitch substrate 210 cannot directly interconnect through second-pitch interconnects 220 to first-pitch die 225. But with a means for interfacing between first-pitch and second-pitch interconnects such as interposer adapter 205, the problem is solved in that first-pitch die interconnects to the means through first-pitch interconnects 226 whereas second-pitch substrate interconnects to the means through second-pitch interconnects 220.

Given this fanout adaptation in interposer adapter 205, I/O signaling for first-pitch die 225 conducts through second-pitch interconnects 220 that interconnect interposer adapter 205 to second-pitch substrate 210. Some of this I/O for first-pitch die 225 couples through vias (not illustrated) in second-pitch substrate 210 and through bottom balls 221 to external devices. For example, first-pitch die 225 may receive its power and ground in this fashion. But the bulk of the I/O signaling for first-pitch die 225 is typically exchanged with second-pitch die 215. To accommodate this I/O signaling between first-pitch die 225 and second-pitch die 215, second-pitch substrate 210 includes lateral interconnects 245.

The footprint (size) considerations for interposer adapter 205 are discussed further below. But because second-pitch substrate 210 accommodates the lateral routing of the I/O signaling between first-pitch die 225 and second-pitch die 215, interposer adapter 205 can be considerably smaller than conventional interposers such as interposer 115 of FIG. 1A. In particular, interposer adapter 205 will typically be smaller than first-pitch die 225. In such an embodiment, first-pitch die 225 may be stacked over a portion of second-pitch die 215 and also over at least a portion of an optional spacer 230. Alternatively, second-pitch die 225 may have no overlap with first-pitch die 215 and instead be supported by just interposer adapter 205 and spacer 230. The amount of overlap on second-pitch die 215 is a tradeoff in that the more first-pitch die 225 can overlap onto second-pitch die 215, the smaller is the size of the resulting system-in-package because second-pitch substrate 210 may then be made smaller in light of the overlap. However, a second-pitch die 215 such as an SOC may generate substantial heat, which could then adversely affect operation of first-pitch die 225. Thus, the amount of overlap balances the need for size reduction and heat considerations. In yet another alternative embodiment, interposer adapter 205 may be as large as or larger than first-pitch die 225 such that no spacer is required. In such an embodiment, first-pitch die 225 would not overlap other structures beside interposer adapter 205.

A second first-pitch die 235, a second interposer adapter 240, and a second spacer 245 may be arranged in a complementary fashion to interposer adapter 205 and second-pitch die 215 as shown in FIG. 2. Thus, first-pitch die 235 interconnects through first-pitch interconnects 226 to interposer adapter 240, which in turn interconnects through second-pitch interconnects 220 to second-pitch substrate 210 at one side of second-pitch die 215. Conversely, interposer adapter 205 interconnects through second-pitch interconnects 220 to second-pitch substrate 210 at an opposing side of second-pitch substrate 215. Indeed, any number of interposer adapters and corresponding first-pitch dies may be associated with one or more second-pitch dies in this fashion.

Interposer Adapter Footprint

The minimum size or footprint of interposer adapter 205 is driven by the number of I/O signals (the I/O bus width) for first-pitch die 225 and the pitch for second-pitch interconnects 220. For example, suppose that first-pitch die 225 is a Wide I/O memory die having a Wide I/O data bus width of over 800 signals and that second-pitch substrate 210 is an organic substrate. The second-pitch interconnects may then be TCFCs having a pitch of 100 microns. At such a pitch, TCFCs can support one-hundred input/output signals per square millimeter of surface area. Thus, if the interposer adapter 205 is just 3×6 mm, it can couple to 1800 TCFCs, which is considerably greater than is necessary. The limiting factor for the footprint of interposer adapter 205 is thus the pitch for second-pitch interconnects 220. In general, interposer adapter 205 can readily accommodate the necessary fan-out from first-pitch interconnects 226 to second-pitch interconnects 220 in a footprint that is relatively small compared to the size of first-pitch die 225. For example, the footprint of a current generation wide Wide I/O memory is 7×9 mm. But as discussed above, an interposer adapter 205 for such a die may be just 3×6 mm.

Figure 3:
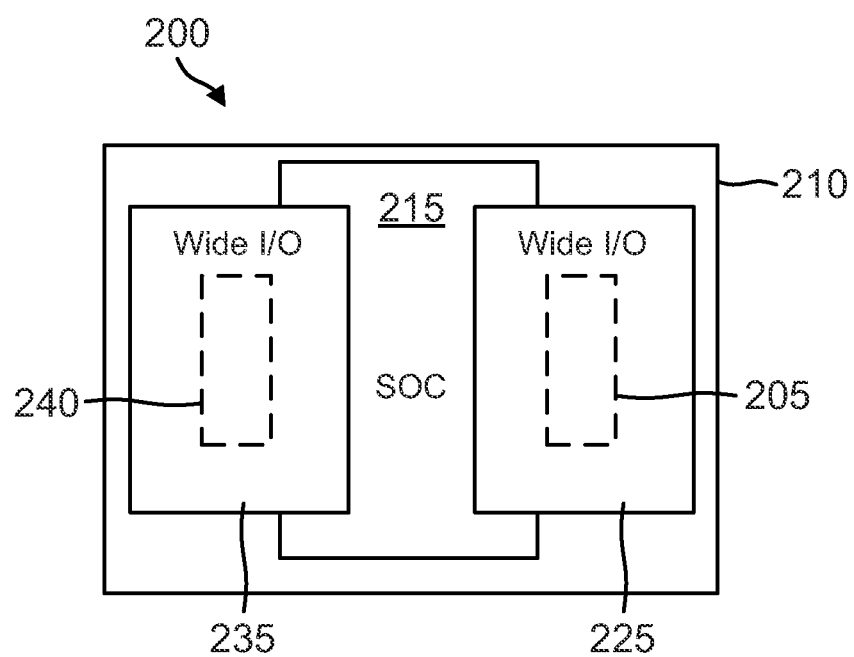
FIG. 3 is a plan view of the footprints on the organic substrate for the second-pitch die and the first-pitch dies of FIG. 2.

FIG. 3 shows example footprints of first-pitch dies 225 and 235 as well as second-pitch die 215 on second-pitch substrate 210. Since interposer adapters 240 and 205 interconnect between first-pitch dies 225 and 235 (respectively) and second-pitch substrate 210, their footprints are shown with dotted lines. Note the relatively small size for interposer adapters 240 and 205 compared to that for first-pitch dies 225 and 235. In contrast, a conventional interposer such as interposer 115 of FIG. 1A would have virtually the same size as second-pitch substrate 210 to accommodate the I/O signaling between second-pitch die 215 and first-pitch dies 225 and 235.

Methods of Manufacture

Figure 4:
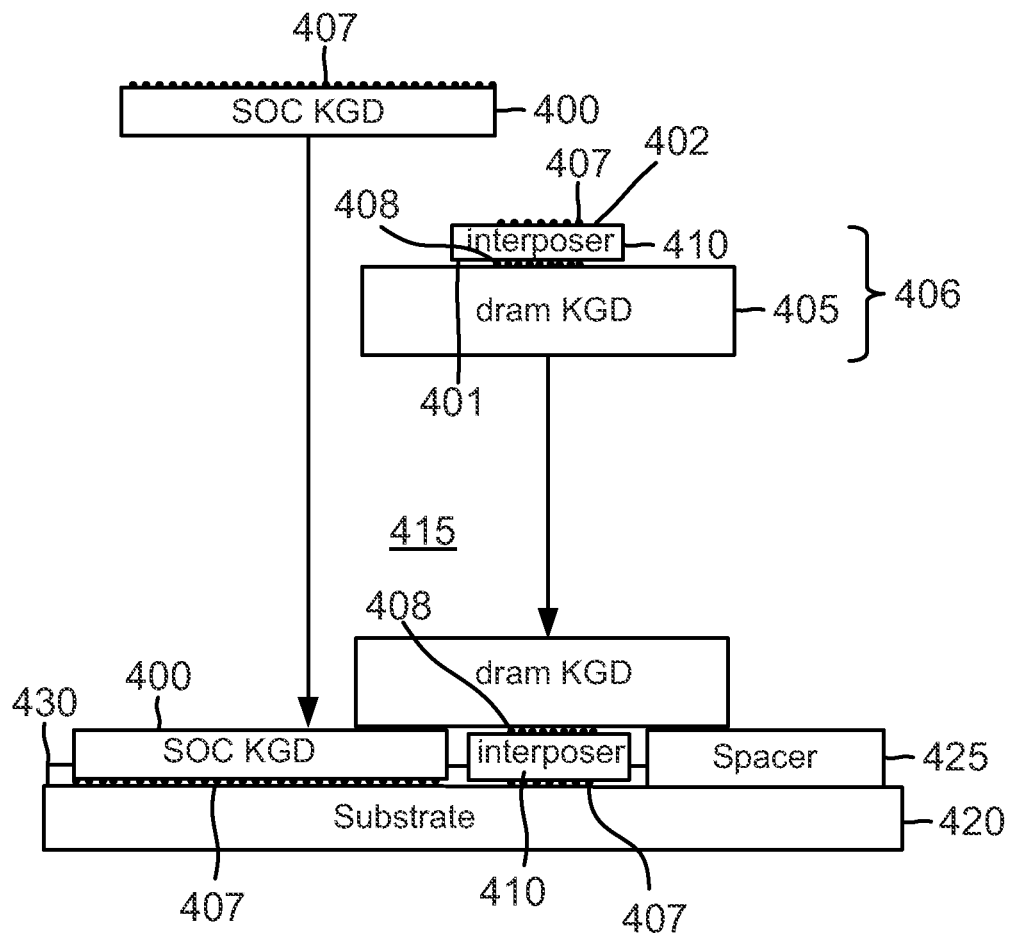
FIG. 4 is a cross-sectional view of a partial system-in-package assembly including a second-pitch die and an interposer adapter assembly.

A first example fabrication method will now be discussed. After a wafer of first-pitch dies has been fabricated and each proven to be known good die (KGD), interposer adapters may be interconnected to the wafer onto their respective first-pitch die footprints through first-pitch interconnects prior to dicing the wafer. With regard to the dicing, it may be appreciated that an upper size limit for suitable interposer adapters is approximately the same size as the footprints for their corresponding first-pitch dies in that the dicing lanes between the footprints on the wafer must be left open. Prior to interconnection to the wafer, the interposer adapters would be prepared by forming the first-pitch and second-pitch interconnects on opposing sides of the interposer adapters. For example, the second-pitch interconnects may be TCFCs whereas the first-pitch interconnects may be micro-bumps. The wafer may then be diced into individual interposer adapter assemblies. An example interposer adapter assembly 406 is shown in FIG. 4. In this embodiment, a first-pitch die 405 is a DRAM KGD. Interposer adapter 410 has a first-pitch-die-facing surface 401 and a substrate-facing surface 402. First-pitch interconnects 408 on surface 401 comprise micro-bumps whereas second-pitch interconnects 407 on surface 402 comprise TCFCs. Interposer adapter 410 interconnects to first-pitch die 410 through first-pitch interconnects 408. Assembly 406 is advantageous in that the relatively coarse pitch for second-pitch interconnects 407 on surface 402 of interposer adapter 410 enables a test fixture to probe all the I/O signals to fully establish that first-pitch die 405 is a known good die (KGD) and that interposer adapter 410 functions properly as well. In contrast, the relatively fine pitch of first-pitch die 405 prevents a test fixture from fully probing all the I/O signals prior to its inclusion in assembly 406.

An analogous process is used to form a plurality of second-pitch dies such as SOC dies on a corresponding wafer. After second-pitch interconnects have been deposited on each second-pitch die so they can be tested (those passing the test being KGDs), the wafer is diced to form individual second-pitch dies such as a second-pitch KGD SOC 400 having second-pitch interconnects 407. Second-pitch KGD SOC 400 may then be flipped so that its active surface (the surface with second-pitch interconnects 407) may be mounted onto a second-pitch substrate 420. A spacer 425 may also be mounted on second-pitch substrate 420 at this time using, for example, a die attach film. Assembly 406 may then be flipped so that interposer 410 may be interconnected through second-pitch interconnects 407 to second-pitch substrate 420. First-pitch KGD DRAM 405 then overlaps onto a back surface of second-pitch KGD SOC 400 and spacer 425. In that regard, the height of second-pitch KGD SOC 400 and its second-pitch interconnects 407, the height of interposer adapter 410 and its second-pitch interconnects 407 and first-pitch interconnects 408, and the height of spacer 425 and its die attach film should all be within a sufficient tolerance of each other so that first-pitch KGD DRAM 405 is not stressed by any resulting non-planarity of its mounting points on spacer 425, interposer adapter 410, and second-pitch KGD SOC 400. An underfill 430 may then be applied to encapsulate the second-pitch interconnects 407 such as TCFCs (or other suitable interconnects) between second-pitch substrate 420 and second-pitch KGD SOC 400/interposer adapter 410 to complete a partial system-in-package (SIP) assembly.

Figure 5:
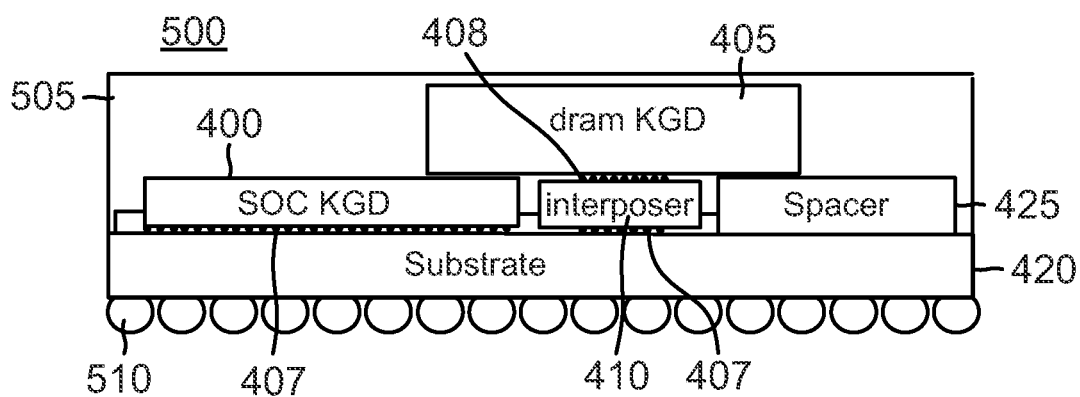
FIG. 5 illustrates the partial system-in-package assembly of FIG. 4 after application of mold compound and bottom solder balls to provide a completed system-in-package assembly.

As shown in FIG. 5, a mold compound 505 (e.g., a thermally-conductive mold compound) may then be applied to encapsulate first-pitch KGD DRAM 405, spacer 425, and second-pitch KGD SOC 400. After attachment of bottom balls 510 and satisfactory testing, an SIP assembly 500 is completed. Should mold compound 505 be a thermally-conductive mold compound, heat dissipation from second-pitch KGD SOC 400 and first-pitch KGD DRAM 405 may occur in two directions: downward via a second-pitch interconnect 407/second-pitch substrate 420/bottom ball 510 path, and upward through the thermally conductive mold compound to an optional system heat sink. It will be appreciated that interposer adapter assembly 406 is not limited to a single first-pitch die such as DRAM 405. There may be multiple first-pitch dies in a three-dimensional (3D) TSS stack analogous to the stacking of dies 145 and 150 discussed with regard to TSS 130 of FIG. 1B. But in contrast to TSS 130, second-pitch SOC 400 does not require through substrate vias. Moreover stacked first-pitch dies may be readily tested through incorporation into a corresponding interposer adapter assembly whereas TSS 130 does not provide such complete test accessibility.

In alternative manufacturing methods, interposer adapter 410 would not be initially attached to first-pitch KGD DRAM 405 to form interposer-adapter assembly 406 as discussed with regard to FIG. 4. Instead, interposer adapter 410 would be separately interconnected through second-pitch interconnects 407 to second-pitch substrate 420 in conjunction with the interconnecting of second-pitch KGD SOC 400 through second-pitch interconnects 407 to second-pitch substrate and the attachment of spacer 425. First-pitch KGD DRAM 405 would then be interconnected to interposer 410 through first-pitch interconnects 408 to second-pitch substrate 420 so as to rest on its mounting points on spacer 425 and second-pitch KGD SOC 400. After an optional application of underfill 430 and then application of mold compound 505, SIP assembly 500 is completed. Thus, such an alternative method of manufacturing does not produce structural differences in the finished SIP assembly.

Figure 7:
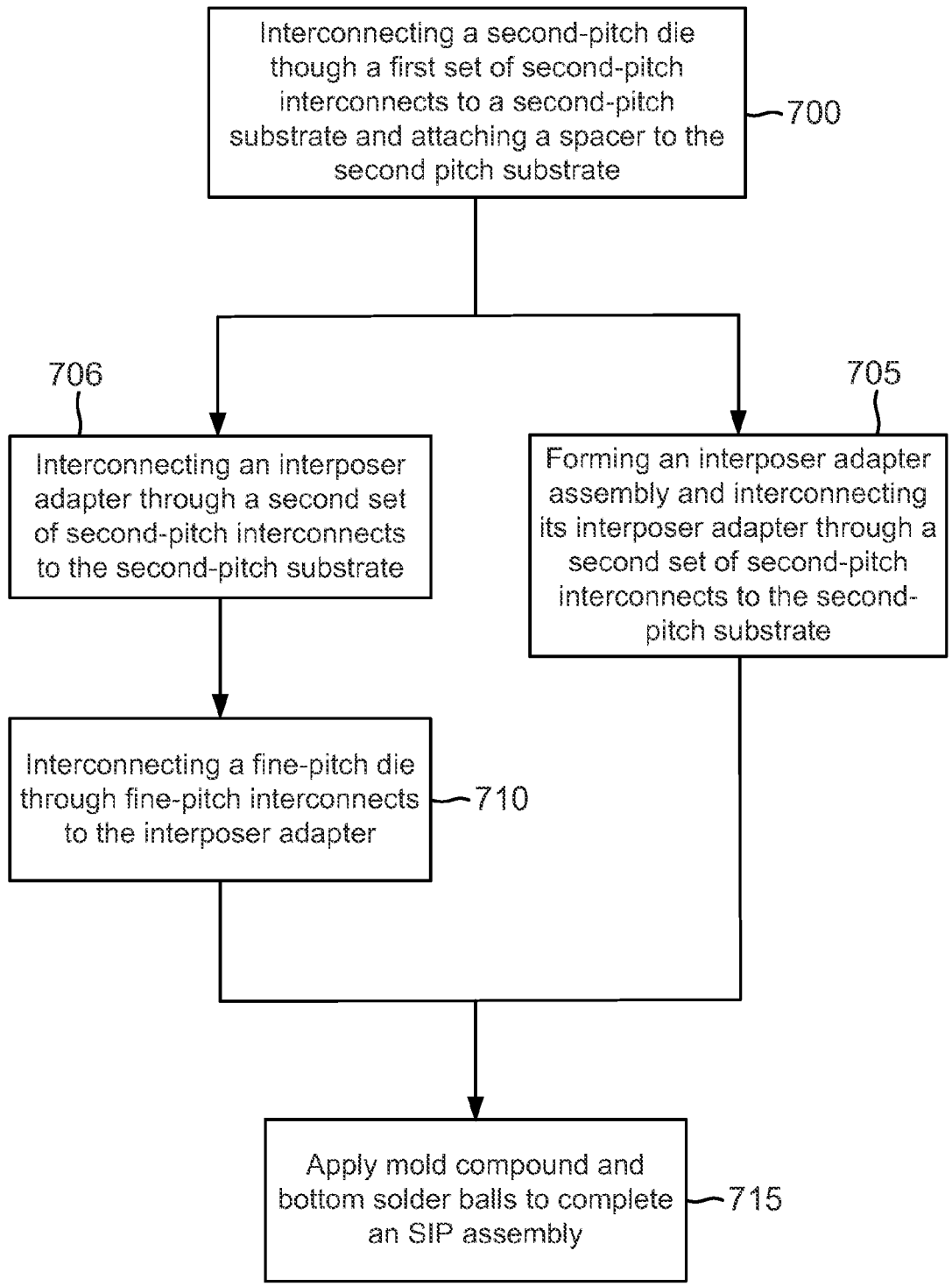
FIG. 7 is a flowchart of methods of manufacturing a system-in-package assembly including an interposer adapter.

The methods of manufacture disclosed herein are summarized in the flowchart of FIG. 7. In a step 700, the second-pitch die is interconnected through second-pitch interconnects to the second-pitch substrate. In addition, any spacer(s) are mounted to the second-pitch substrate at this time. If an interposer adapter assembly has been formed, the interposer adapter in the assembly (or assemblies) may then be interconnected through second-pitch interconnects to the second-pitch substrate in a step 705. If an interposer adapter assembly is not used, the interposer adapter is interconnected through second-pitch interconnects to the second-pitch substrate in a step 706. Following step 706, the first-pitch die would be interconnected through first-pitch interconnects to the interposer adapter in a step 710. In a step 715, the alternative manufacturing method merge with the application of mold compound and the bottom solder balls to compete the system-in-package assembly.

Example Electronic Systems

Figure 6:
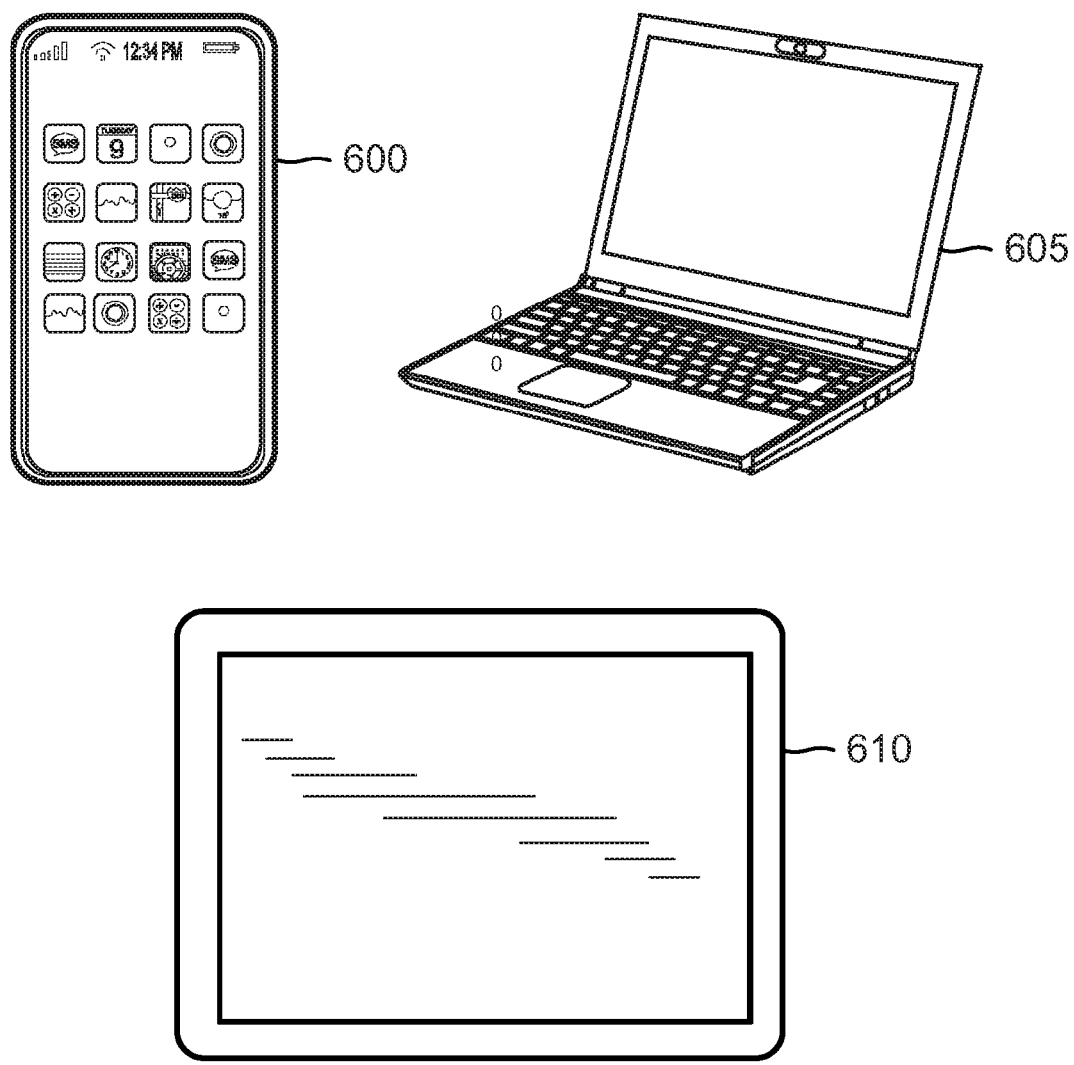
FIG. 6 illustrates a plurality of electronic systems incorporating a system-in-package assembly in accordance with embodiments disclosed herein.

The system-in-package (SIP) assemblies disclosed herein may be incorporated into a wide variety of electronic systems. For example, as shown in FIG. 6, a cell phone 600, a laptop 605, and a tablet PC 610 may all include a SIP constructed in accordance with the disclosure. Other exemplary electronic systems such as a music player, a video player, a communication device, and a personal computer may also be configured with SIPs constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An integrated circuit, comprising:
a first-pitch die;
a second-pitch substrate;
a second-pitch die interconnected to the second-pitch substrate through a first set of second-pitch interconnects; and
an interposer adapter interconnected to the second-pitch substrate through a second set of second-pitch interconnects, wherein the first-pitch die is interconnected to the interposer adapter through first-pitch interconnects, the interposer adapter including a plurality of through substrate vias configured to couple the first-pitch interconnects to the second set of second-pitch interconnects, and wherein a pitch for the first-pitch interconnects is less than a pitch for the second-pitch interconnects.

2. The integrated circuit of claim 1, wherein the second-pitch substrate includes a plurality of lateral interconnects configured to couple between the first and second sets of second-pitch interconnects to carry I/O signals between the second-pitch die and the first-pitch die.

3. The integrated circuit of claim 1, further comprising a spacer mounted on the second-pitch substrate, and wherein the first-pitch die is disposed across at least a portion of the spacer, the interposer adapter, and a portion of the second-pitch die.

4. The integrated circuit of claim 1, wherein the second-pitch substrate is an organic substrate.

5. The integrated circuit of claim 1, wherein the interposer adapter comprises a silicon interposer adapter, and wherein the plurality of through substrate vias comprise a plurality of through silicon vias.

6. The integrated circuit of claim 5, wherein the first-pitch die is a Wide I/O memory die and the second-pitch die is a system-on-a-chip (SOC) die.

7. The integrated circuit of claim 6, wherein the first and second sets of second-pitch interconnects are thermo-compression flip-chip bumps (TCFCs), and wherein the first-pitch interconnects are micro-bumps.

8. The integrated circuit of claim 1, wherein the interposer adapter includes at least one redistribution layer to accommodate a fanout from the first-pitch interconnects to the second set of second-pitch interconnects.

9. The integrated circuit of claim 1, wherein the interposer adapter includes a plurality of metal layers to accommodate a fanout from the first-pitch interconnects to the second set of second-pitch interconnects.

10. The integrated circuit of claim 6, further comprising a mold compound encapsulating the SOC die and the Wide I/O memory die.

11. The integrated circuit of claim 6, wherein the integrated circuit is incorporated into at least one of a cellphone, a laptop, a tablet, a music player, a communication device, a computer, and a video player.

12. A method, comprising:
interconnecting a second-pitch die through a first set of second-pitch interconnects to a second-pitch substrate;
interconnecting a first-pitch die to an interposer adapter having a plurality of through substrate vias through first-pitch interconnects to form an interposer adapter assembly, wherein a pitch for the first-pitch interconnects is less than a pitch for the second-pitch interconnects; and
interconnecting the interposer adapter in the interposer adapter assembly through a second set of the second-pitch interconnects to the second-pitch substrate, wherein interconnecting the interposer adapter further comprises coupling the first-pitch interconnects through the through substrate vias to the second set of second-pitch interconnects.

13. The method of claim 12, further comprising attaching a spacer to the second-pitch substrate so as to be spaced apart by from the second-pitch die by a portion of the second-pitch substrate, and wherein interconnecting the interposer adapter in the interposer adapter assembly comprises interconnecting the interposer adapter to the portion of the second-pitch substrate.

14. The method of claim 12, further comprising applying an underfill to the first and second sets of the second-pitch interconnects.

15. The method of claim 14, further comprising encapsulating the first-pitch die and the second-pitch die with mold compound.

16. An integrated circuit package, comprising:
a first-pitch die including a plurality of first-pitch interconnects;

a second-pitch substrate including a first set of second-pitch interconnects, wherein a pitch for the first-pitch interconnects is less than a pitch for the second-pitch interconnects;

a second-pitch die interconnected to the second-pitch substrate through a second set of second-pitch interconnects;

means for interfacing between the first-pitch interconnects and the first set of second-pitch interconnects; and a spacer attached to the second-pitch substrate, wherein the first-pitch die is disposed to overlap a portion of the second-pitch die, the means, and at least a portion of the spacer.

17. The integrated circuit package of claim 16, wherein the second-pitch substrate comprises an organic substrate.

18. The integrated circuit package of claim 17, wherein the first and second sets of second-pitch interconnects are thermo-compression flip-chip bumps (TCFCs) and wherein the first-pitch interconnects are micro-bumps.

19. The integrated circuit package of claim 18, wherein the first-pitch die comprises a Wide I/O memory.

* * * * *